US009159886B2

(12) United States Patent
Ng et al.

(10) Patent No.: US 9,159,886 B2
(45) Date of Patent: Oct. 13, 2015

(54) LIGHTING APPARATUS WITH A CARRIER LAYER

(75) Inventors: Kee Yean Ng, Penang (MY); Bit Tie Chan, Bayan Lepas (MY)

(73) Assignee: Intellectual Discovery Co., Ltd., Seoul (KR)

( * ) Notice: Subject to any disclaimer, the term of this patent is extended or adjusted under 35 U.S.C. 154(b) by 991 days.

(21) Appl. No.: 13/089,698

(22) Filed: Apr. 19, 2011

(65) Prior Publication Data
US 2012/0267657 A1 Oct. 25, 2012

(51) Int. Cl.
H01L 33/50 (2010.01)
H01L 25/075 (2006.01)

(52) U.S. Cl.
CPC ............ H01L 33/504 (2013.01); H01L 33/507 (2013.01); H01L 25/0753 (2013.01); H01L 33/505 (2013.01); H01L 33/508 (2013.01); H01L 2924/0002 (2013.01)

(58) Field of Classification Search
CPC ... H01L 33/504; H01L 33/502; H01L 33/507; H01L 33/505; H01L 33/508; H01L 2924/0002; H01L 2924/00; H01L 25/0753
See application file for complete search history.

(56) References Cited

U.S. PATENT DOCUMENTS

| 7,267,785 | B2 | 9/2007 | Srivastava et al. | |
|---|---|---|---|---|
| 7,819,539 | B2* | 10/2010 | Kim et al. | 362/84 |
| 8,071,995 | B2* | 12/2011 | Sato et al. | 257/98 |
| 8,558,448 | B2* | 10/2013 | Harada | 313/503 |
| 8,664,846 | B2* | 3/2014 | van de Ven et al. | 313/498 |
| 8,723,403 | B2* | 5/2014 | Sun et al. | 313/110 |
| 2005/0218801 | A1* | 10/2005 | Hon et al. | 313/512 |
| 2006/0170332 | A1* | 8/2006 | Tamaki et al. | 313/498 |
| 2007/0258229 | A1* | 11/2007 | Weaver et al. | 362/84 |
| 2008/0089053 | A1* | 4/2008 | Negley | 362/84 |
| 2009/0101930 | A1* | 4/2009 | Li | 257/98 |
| 2010/0129598 | A1* | 5/2010 | Su et al. | 428/116 |
| 2010/0165599 | A1 | 7/2010 | Allen | |
| 2010/0219767 | A1* | 9/2010 | Pumyea et al. | 315/291 |
| 2010/0303468 | A1 | 12/2010 | Mastro et al. | |
| 2010/0323466 | A1* | 12/2010 | Helbing et al. | 438/27 |
| 2011/0180780 | A1* | 7/2011 | Yoo et al. | 257/13 |
| 2011/0297981 | A1* | 12/2011 | Liao et al. | 257/98 |
| 2011/0309390 | A1* | 12/2011 | Liu et al. | 257/89 |
| 2012/0033403 | A1* | 2/2012 | Lamvik et al. | 362/84 |
| 2012/0320607 | A1* | 12/2012 | Kinomoto et al. | 362/351 |

FOREIGN PATENT DOCUMENTS

JP 2008258171 A * 10/2008
WO WO-2010/104276 9/2010

OTHER PUBLICATIONS

Lhu, L. "Angularly Uniform White4 Light-Emitting Diodes Using an Integrated Reflector Cup", *IEEE Photonics Technology Letters*, vol. 22, No. 7, Apr. 1, 2010.

* cited by examiner

*Primary Examiner* — Eva Y Montalvo
*Assistant Examiner* — Diana C Vieira
(74) *Attorney, Agent, or Firm* — Fox Rothschild LLP

(57) ABSTRACT

A lighting apparatus having wavelength-converting materials formed in a carrier layer is disclosed. In one embodiment, the lighting apparatus has a light source attached to a substrate that is assembled in a housing. The light source is configured to emit a substantially narrow band light that is transformed into broad-spectrum white light by the wavelength-converting materials positioned on the carrier layer. The wavelength-converting materials and the carrier layer are distanced away from the light source, such that the carrier layer is thermally isolated from the light source.

16 Claims, 8 Drawing Sheets

LIGHTING APPARATUS WITH A CARRIER LAYER

BACKGROUND

A light-emitting diode (referred to hereinafter as LED) represents one of the most popular light-emitting devices today. In recent years, the luminous efficacy of LEDs, defined in lumens per Watt, has increased significantly from 20 lumens per Watt (approximately the luminous efficacy of an incandescent light bulb) to over 200 lumens per Watt, which greatly exceeds the luminous efficacy of a fluorescent light at 60 lumens per Watt. In other words, for a fixed amount of light output, LEDs consume only one third the power compared to fluorescent lights, and one tenth compared to incandescent light bulbs. Accordingly, it is not surprising today that lighting fixtures with LEDs have recently been replacing incandescent light bulbs and fluorescent light tubes. A new term "Solid-State Lighting" has been created. The term "Solid-State Lighting" refers to the type of lighting that uses semiconductor light-emitting diodes, such as an LED rather than traditional light sources.

In the field of solid-state lighting, most of the light sources are white light. For LEDs, white light may be obtained by a method referred to as "RGB white". In this method, colored light emitted by LEDs, usually in primary colors such as red, green and blue light, is mixed to obtain white light. Another method is to utilize a wavelength-converting material to convert a narrow band light into a broad-spectrum white light. For example, white light can be obtained by converting a narrow band blue or ultra-violet light emitted by an LED die by passing the narrow band light through yellow phosphor. This method is also known as "phosphor converted white". Generally, phosphor converted white method is more popular than the RGB white method, because the RGB white method requires at least three types of LEDs and careful consideration on light mixing.

Most light sources used in solid-state lighting may be further categorized by color temperature. The color temperature of a light source indicates the relative color appearance of the particular light source on a scale from "warmer" (more yellow/amber) to "cooler" (more blue) light. Color temperatures are generally given in Kelvin or K. Color temperatures over 5,000 K are called cool colors (bluish white), while lower color temperatures (2,700-3,000 K) are called warm colors (yellowish white through red). For phosphor converted white method, the color point of the light is determined by the type of phosphor or the composition of the phosphor if more than one type of phosphor is utilized. In most white LED devices, the phosphor may be mixed with an encapsulant. The phosphor is often in direct contact with the light source die. However, the light source is known to be a heat source of the light-emitting device. This may not be desirable because the heat may affect the phosphor material. In addition, the color point of a phosphor converted white LED may be difficult to control and often the process variation may be huge. Generally, one solution is to bin the color temperature and the brightness of the LEDs so that LEDs with similar brightness can be obtained and fixed into lighting fixture. The binning process resulted in production yield loss as the process variation for phosphor may be huge.

From lighting fixture manufacturer's perspective, the binning is not desirable. In order to fulfill the market needs of a wide range of color temperature ranging from warm white lighting fixtures to cool white lighting fixtures, lighting fixture manufacturers may have to manage significant inventories as the LEDs are categorized into many small color and brightness bins for each color temperature.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
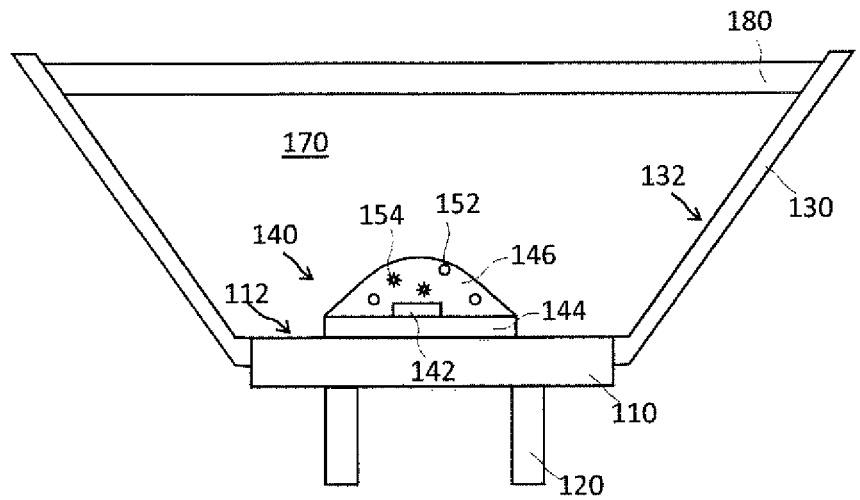
FIG. 1 illustrates a cross-sectional view of a lighting apparatus having a packaged white LED.

FIG. 1 illustrates a cross-sectional view of a lighting apparatus 100. The lighting apparatus 100 comprises a substrate 110, a connector 120, a housing 130 and a light source 140. The light source 140 may be surrounded by air 170 without further encapsulation material. An optional diffuser 180 may be attached to the housing 130 for diffusing light emitted by the light source 140. Optionally, a surface 112 of the substrate 110 and a surface 132 of the housing 130 may be made highly reflective to direct light in a predetermined direction. The reflective surfaces 112 and 132 may be known as a reflector in the lighting apparatus 100. The connector 120 may be connected to an external power source (not shown) in order to drive the light source 140. The connector 120 may be configured in the form of a socket, a pin, or in any other suitable shape for electrical connection purposes. In some situations, the connector 120 may provide mechanical support, for example, to attach the entire lighting apparatus 100 to a wall or a ceiling.

In the embodiment shown in FIG. 1, the light source 140 is a packaged LED light source. The light source 140 comprises a semiconductor light source die 142 attached to a body 144.

The light source die 142 may be further encapsulated by an encapsulant 146. The light source die 142 may be configured to emit a narrow band light, which may then be converted into broad-spectrum white light by passing through one or more wavelength-converting materials 152-154. The wavelength-converting materials 152-154 shown in the drawings are for illustrative purposes only. The actual size of each particle of the wavelength-converting materials 152-154 is comparatively much smaller than illustrated and may not be visible in the scale of the drawings. In the embodiment shown in FIG. 1, the wavelength-converting materials 152-154 may be yellow phosphor and red phosphor, respectively. The composition and ratio of the yellow phosphor and red phosphor may be adjusted accordingly to obtain the desired different color points. For example, in order to obtain a warmer color, the composition of red phosphor may be increased compared to the composition for a cooler color.

Generally, the encapsulant 146 is configured to protect the light source die 142. However, for white light sources, such as the light source 140, in addition to the functioning as a protective layer for the light source die 142, the encapsulant 146 may also serve a second purpose of being a carrier for the wavelength-converting materials 152-154. The wavelength-converting materials 152-154 may be mixed in the encapsulant 146 in liquid or semi-liquid form during the manufacturing process and subsequently cured into solid form. One type of the wavelength-converting materials 152 or 154 may be sufficient, depending on the light source die 146 and desired light color output. However, having two different types of wavelength-converting materials 152-154 may increase the color-rendering index of the light source 140. In fact, there may be more than two different types of the wavelength-converting materials 152-154.

Due to the close proximity between the wavelength-converting materials 152-154 and the light source die 142, heat may be propagated to the wavelength-converting materials 152-154 and potentially affect the performance of the light source 140. In addition, the process of mixing the wavelength-converting materials 152-154 and the coating of the wavelength-converting materials 152-154 to the light source die 142 may be susceptible to process variation. As a result, the light source 140 produced may result in being sorted into different color bins and brightness bins. In general, lighting fixture manufacturers do not manufacture packaged LED. Therefore, in order to have different color points, the manufacturer may need to stock different types of packaged LED having different color points. In addition, the packaged LEDs are purchased in respective color and brightness bins and this makes the inventory management more challenging.

Figure 2:
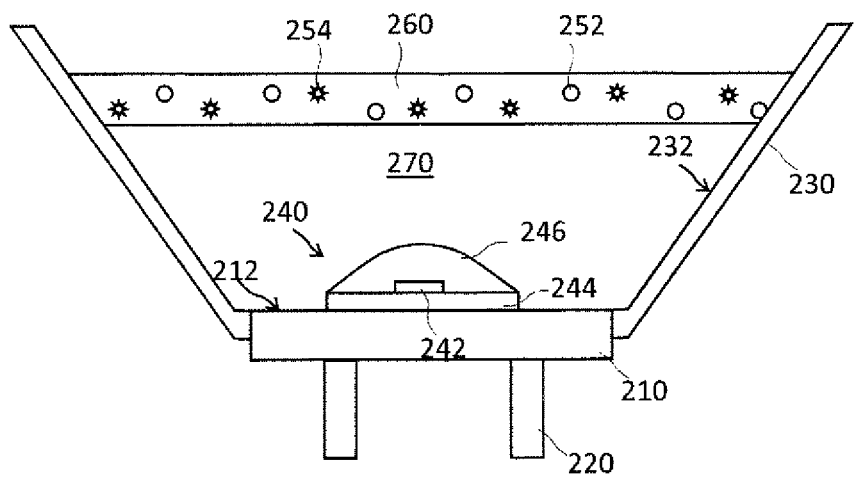
FIG. 2 illustrates a cross-sectional view of a lighting apparatus having a carrier layer.

An effective way to improve the inventory management is to use a carrier layer 260, as shown in FIG. 2 and by implementing the teachings herein. FIG. 2 illustrates an embodiment showing a cross-sectional view of a lighting apparatus 200 that comprises a substrate 210, a connector 220, a housing 230, a light source 240 and a carrier layer 260. The carrier layer 260 is thermally isolated from the light source 240, for example, through air 270 as shown in FIG. 2. In the embodiment shown in FIG. 2, the light source 240 is a packaged LED configured to emit a narrow band light, but without the wavelength-converting materials 152-154 in the encapsulant 146, as shown in FIG. 1. The light source 240 comprises a body 244 and a light source die 242 that is attached to the body 244. The light source die 242 is encapsulated by a transparent encapsulant 246. The wavelength-converting materials 252-254 are not part of the packaged LED. Instead, the wavelength-converting materials 252-254 are formed in a carrier layer 260, as shown in FIG. 2. The connector 220 may be a pair of conductive pins configured to connect to a power source (not shown). In another embodiment, the connector 220 may be in the form of a socket.

The carrier layer 260 may be glass, molded plastic, epoxy or any other similar material to carry the wavelength-converting materials 252-254. For example, the carrier layer 260 may be formed by mixing an epoxy and two different phosphor materials in liquid form and subsequently curing the mixture into a solid form before attaching the carrier layer 260 to the housing 230. The carrier layer 260 may also function as a diffuser. Light, after passing through the wavelength-converting materials 252-254, is more diffused. In addition, a surface (not shown) of the carrier layer 260 may be roughened, in order to further enhance light diffusion.

In the embodiment shown in FIG. 2, the light source die 242 may be a blue LED die or a UV LED die. The light may pass directly go through the carrier layer 260, or be reflected by one or more of the reflective surfaces 212 and 232 of the housing 230 before passing through the carrier layer 260. The light emitted directly from the light source die 242, and the light reflected from the reflective surfaces 212 and 232 may be mixed in the air 270. In the carrier layer 260, the light is converted into broad-spectrum white light by the wavelength-converting materials 252-254 into a substantially white light having a particular color point. The color point of the light after passing through the carrier layer 260 is determined by the composition of the wavelength-converting materials 252-254 and the type of light source die 242 used. There may also be more than two different types of the wavelength-converting materials 252-254. In yet another embodiment, the carrier layer 260 of the lighting apparatus 200 may be removably replaceable with another carrier layer 260 having a to different composition of the wavelength-converting materials 252-254 in order to obtain a substantially white light having a second color point. Therefore, color point of the lighting apparatus 200 may be changed by replacing the carrier layer 260 having a different composition of the wavelength-converting material 252-254.

From a manufacturing cost perspective, the lighting apparatus 200 may be preferred compared to the lighting apparatus 100, because of the inventory management convenience. Consider a scenario in which both the lighting apparatus 100 and the lighting apparatus 200 are to be manufactured with six different color points. In the case of the lighting apparatus 100, other than the material such as the substrate 110, the connectors 120, the housing 130, at least six different light sources 140 are required to be stocked by the manufacturer. In most cases, the light sources 140 required may be more than six, because the packaged LEDs are generally sold in multiple color bins and brightness bins. For lighting apparatus 100 having more than one packaged LED, the color binning needs to be taken into consideration because in order to be utilized in the same lighting fixture, the light sources 140 typically need to have substantially similar color points. As a result, if the packaged LEDs are in four-sub color bins for each color point, a total of twenty-four different light sources 140 are required.

In contrast, in order to manufacture the lighting apparatus 200, the above binning requirements are no longer necessary. In order to obtain six different color points, the manufacturer may only need to stock the various necessary materials. In the example given above, the manufacturers will build six different types of the carrier layer 260 by changing the composition of the wavelength-converting materials 252-254, and one color bin of the light source 240 instead of twenty-four different light sources. In general, a packaged light source 240 without the wavelength-converting material 252-254 can be better controlled in manufacturing process and the number of bins required is less. In addition, for lighting apparatus 200 having more than one light source 240, the light emitted from each light source 240 are mixed in the air 270 prior to wavelength conversion, which may help to reduce binning requirements. For example, consider a lighting apparatus 200 using two different light sources 240 with slightly different colors from different color bins. As the light emitted from the light sources 240 are mixed in the air 270, the differences may be hardly noticeable especially after the color light is converted into white after going through the carrier layer 20.

Compared to the lighting apparatus 100, the lighting apparatus 200 differs at least from the perspective that the wavelength-converting materials 252-254 are distanced away from the light source 240. The light source 240 generates heat during operation. Being positioned away through a layer of air 270, the wavelength-converting materials 252-254 are substantially thermally separated from the light source 240. In the embodiment shown in FIG. 1, heat may reach the wavelength-converting materials 152-154 through thermal conduction and thermal radiation. However, in the embodiment shown in FIG. 2, heat may reach the wavelength-converting material 252-254 only by means of thermal radiation due to the separation. This may reduce the operating temperature of the wavelength-converting material 252-254 substantially.

The lighting apparatus 200 may be any lighting fixtures or lighting system having more or less features or functionality than described herein. In addition, in order to fully utilize the benefits of having LEDs as its light source 240, the lighting apparatus 200 may comprise other components, such as controllers, PWM generators, which are not shown in the embodiment shown in FIG. 2. The lighting apparatus 200 may also comprise optional electronic components, such as ambient light sensors, a color sensor, additional reflectors, or other similar components.

The carrier layer 260 may be manufactured in many different ways. In the embodiment shown in FIG. 2, the carrier layer 260 is formed through a molding process by premixing the wavelength-converting material 252-254 in an epoxy or silicone followed by a curing process. Generally, the wavelength-converting materials 252-254 may be substantially equally distributed throughout the entire carrier layer 260. For such carrier layers 260, double conversion may happen. Double conversion is a phenomenon in which a narrow band light is converted by two different types of the wavelength-converting materials 252-254. For example, in the embodiment shown in FIG. 2, light may be first converted by one of the wavelength-converting materials 252-254 into the a broad-spectrum white light. However, the broad-spectrum white light is then converted again by the other of the wavelength-converting materials 252-254.

In general, the wavelength-converting material 252 or 254 is only effective on specific narrow band light. For example, a blue narrow band light, after being converted comprises a broad-spectrum white light having a peak wavelength at the original blue band light. When the light passes through a second conversion by the other wavelength-converting materials 252-254, typically only the portion of light having wavelength at the peak blue wavelength is affected by the second conversion. Double conversion may be avoided by making the carrier layer 260 via other methods. One example is a coating or printing method for applying the wavelength-converting materials 252-254 to the carrier layer 260. This is illustrated in the embodiment shown in FIG. 3A.

Figure 3A:
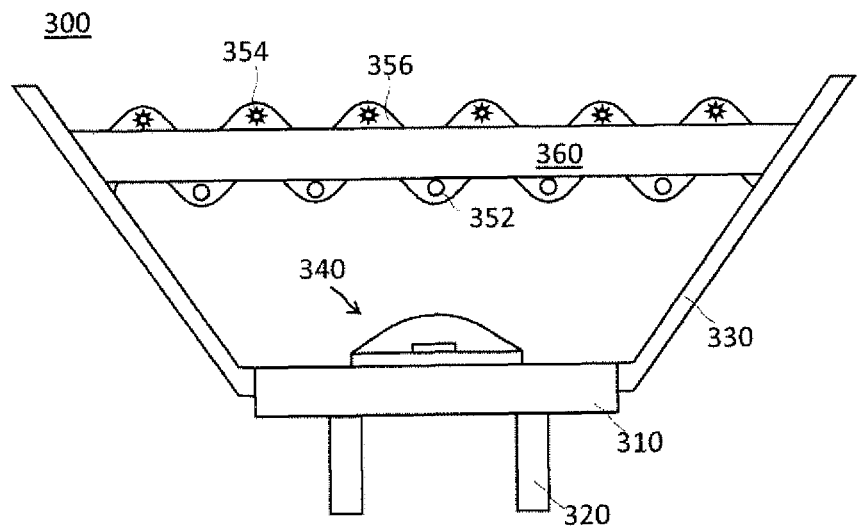
FIG. 3A illustrates a cross-sectional view of a lighting apparatus having a carrier layer with wavelength-converting material printed on both sides.
Figure 3B:
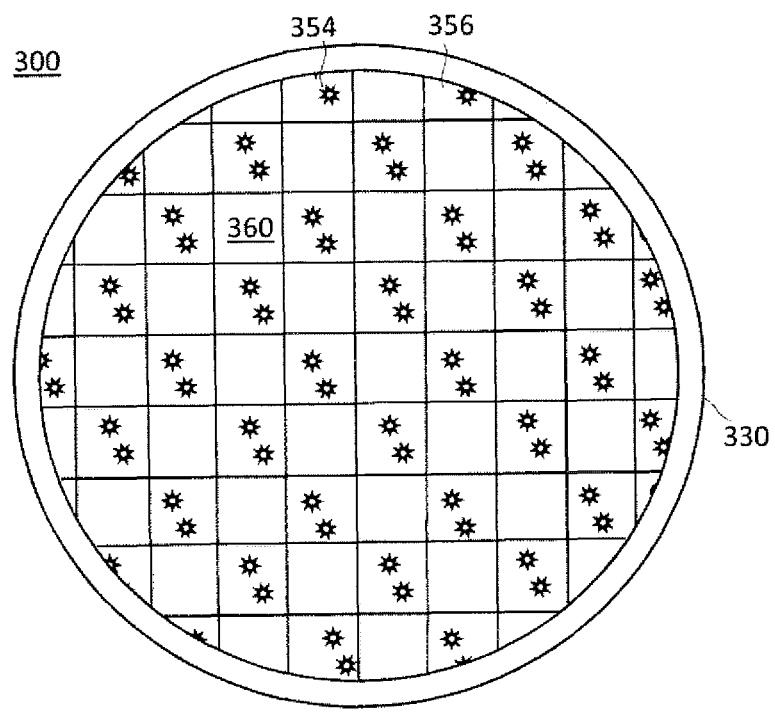
FIG. 3B illustrates a top view of the lighting apparatus shown in FIG. 3A.

FIG. 3A illustrates a cross-sectional view of a lighting apparatus 300. The top view of the lighting apparatus 300 is shown in FIG. 3B. The lighting apparatus 300 comprises a substrate 310, a connector 320, a housing 330, a light source 340 and a carrier layer 360. The lighting apparatus 300 is substantially similar to the lighting apparatus 200, but differs at least in that the wavelength-converting materials 352-354 are formed on the surface of the carrier layer 360. In the embodiment shown in FIG. 3, the carrier layer 360 may be a transparent glass, or a molded plastic or other similar transparent or semi-transparent material. Optionally, one surface (not shown) of the carrier layer 360 may be roughened to enhance light diffusion. The wavelength-converting materials 352-354 may be printed or coated on one or both surfaces of the carrier layer 360. The wavelength-converting materials 352-354 may be premixed in a medium 356 suitable to be coated or printed on the surface of the carrier layer 360. By applying the wavelength-converting materials 352-354 in the manner shown in FIG. 3A, the wavelength-converting materials 352-354 may be manufactured in a thin layer independent of the thickness of the carrier layer 360. On the other hand, in the lighting apparatus 200 of FIG. 2A, the carrier layer 260 has a minimum thickness and the wavelength-converting materials 252-254 cannot be made thinner than the carrier layer 260.

By not mixing both types of the wavelength-converting material 352-354, the wavelength-converting materials 352-354 may be applied separately in a more controllable manner. For example, in the embodiment shown in FIG. 3A and FIG. 3B, each of the wavelength-converting materials 352-354 is formed on opposite sides of the carrier layer 360. The wavelength-converting materials 352-354 may be arranged in a checker board pattern with minimal overlapping, such that a substantial portion of light passing through the carrier layer 360 will be converted by only one of the wavelength-converting materials 352-354, due to such a non-overlapping arrangement. In another embodiment, the wavelength-converting materials 352-354 may be coated or printed in other patterns, such as in round shapes, triangular, rectangular, or other alternating or systematic patterns. In yet another embodiment, a portion of the carrier layer 360 may not be coated or printed on either side such that the non-coated portion is substantially void of any wavelength converting material and substantially transparent. This will permit narrow band light, such as blue or green in color to exit the lighting apparatus 300. However, the light will be mixed in the surrounding medium of the lighting apparatus 300 and the overall light emitted will be perceived as substantially white light.

Figure 4A:
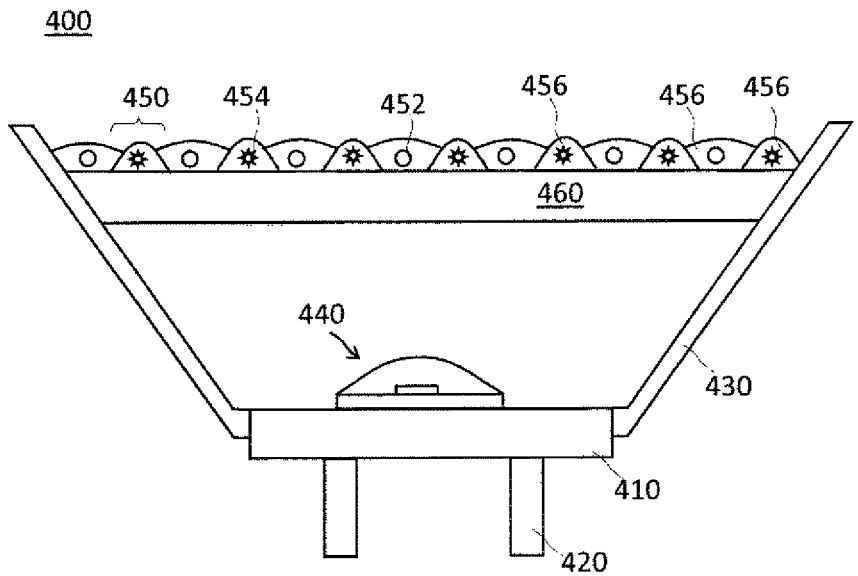
FIG. 4A illustrates a cross-sectional view of a lighting apparatus having a carrier layer with wavelength-converting material encapsulated in encapsulant.
Figure 4B:
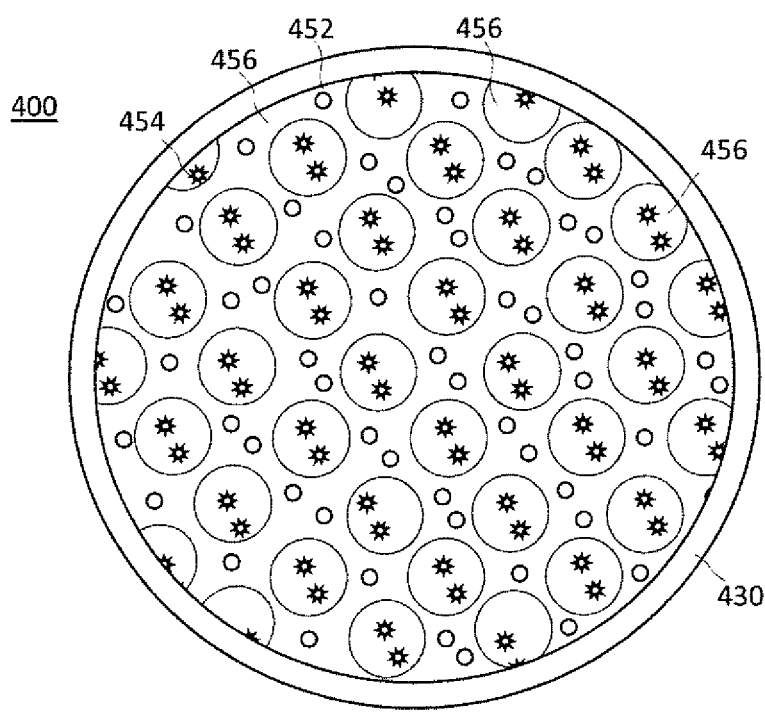
FIG. 4B illustrates a top view of the lighting apparatus shown in FIG. 4A.

FIG. 4A illustrates a cross-sectional view of a lighting apparatus 400 having a carrier layer 460 with the wavelength-converting materials 452-454 encapsulated in an encapsulant 456. The top view of the lighting apparatus 400 is shown in FIG. 4B. The lighting apparatus 400 comprises a substrate 410, a connector 420, a housing 430, a light source 440 and a carrier layer 460. In the embodiment shown in FIG. 4A, the wavelength-converting materials 452-454 are separately premixed in an encapsulant 456, such as epoxy, silicone or other similar material in a liquid or semi-liquid form. One of the wavelength-converting materials 452-454 is then dispensed in a systematic manner in droplets 450 on one surface of the carrier layer 460. Droplets 450 are shown on the top surface FIG. 4A, but may alternatively be dispensed on the lower surface of carrier layer 460. The carrier layer 460 may be a glass, plastic or any other similar transparent or semi-transparent material.

In the embodiment shown in FIG. 4B, the wavelength-converting material 454 is dispensed in a systematic manner on a top surface and subsequently the encapsulant 456 is then cured into a solid form. The other wavelength-converting material 452 is then dispensed to fill in the openings around the droplets 450 of wavelength-converting material 454 that have already been formed. As a result, the wavelength-converting material 452-454 is arranged in a manner as shown in FIGS. 4A and 4B.

Figure 5A:
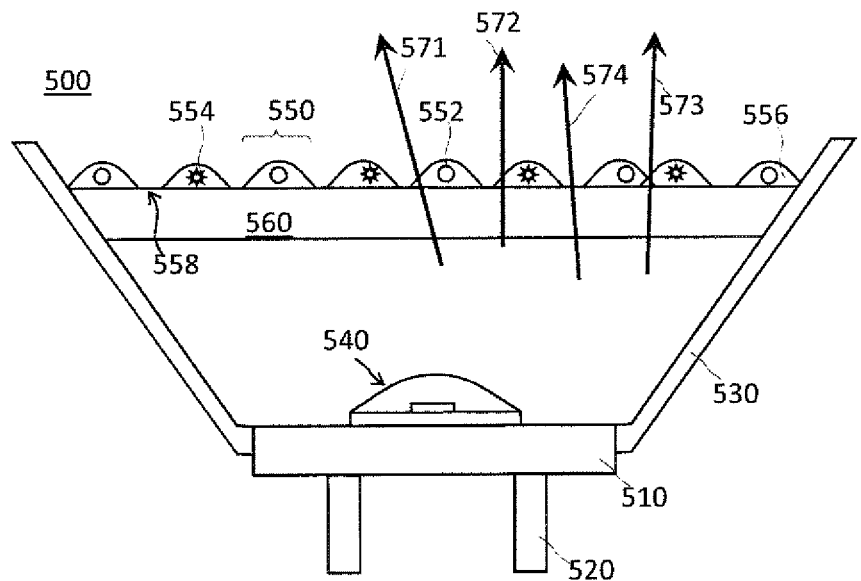
FIG. 5A illustrates a cross-sectional view of a lighting apparatus having a carrier layer with transparent portions.
Figure 5B:
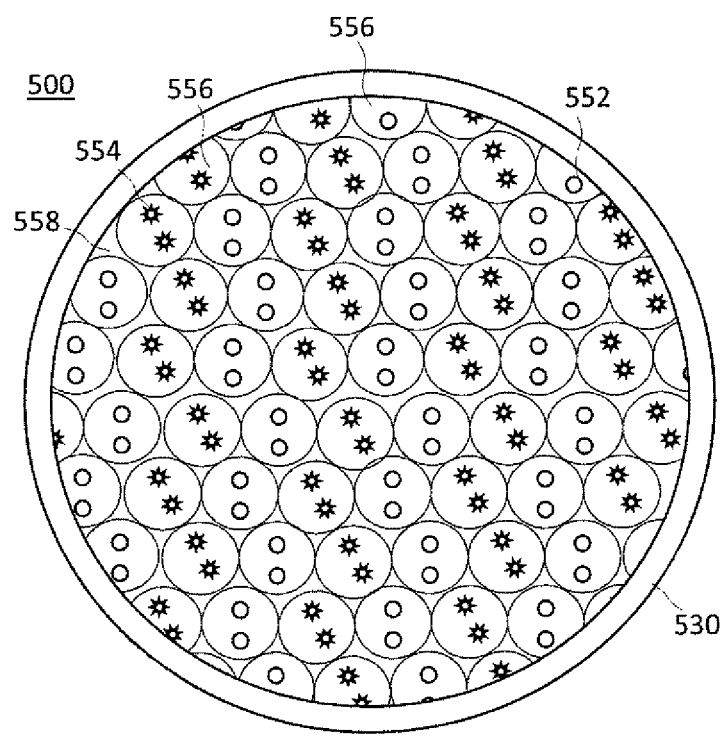
FIG. 5B illustrates a top view of the lighting apparatus shown in FIG. 5A.

In yet another embodiment, both the wavelength-converting materials may be arranged in a systematic pattern as shown in the embodiment of FIGS. 5A and 5B. FIG. 5A is a cross-sectional view of a lighting apparatus 500, while a top view of the lighting apparatus 500 is shown in FIG. 5B. The lighting apparatus 500 comprises a substrate 510, a connector 520, a housing 530, a light source 540 and a carrier layer 560. The lighting apparatus 500 is substantially similar but differs from the lighting apparatus 400 at least in that both the wavelength-converting materials 552-554 are placed in droplets 550 arranged in a specific manner. The specific pattern or manner may not be limited to only a matrix, rows or columns, but may be any other substantially systematic arrangement. An example is shown in FIGS. 5A and 5B. The wavelength-converting materials 552-554 are placed in droplets 550 of epoxy 556, arranged in a substantially systematic manner having alternately interlaced columns that do not form a straight line.

The droplets 550 may slightly overlap each other. In the embodiment shown in FIG. 5B, the droplets 550 are substantially circular. Therefore, the space 558 between the droplets 550 may be substantially transparent and not be covered by the wavelength-converting materials 552-554. As a result, light generated through the light source 540 after passing through the carrier layer 560 in the embodiment shown in FIG. 5B may be divided into four components 571-574, i.e. a first substantially white light 571 having a first white point defined by the first wavelength-converting material 552, a second substantially white light 572 having a second white point defined by the second wavelength-converting material 554, a third substantially white light 573 having a third white point after passing through both the first and second wavelength-converting materials 552 and 554, and blue light 574 as emitted by the light source 540 without being converted by either of the wavelength-converting materials 552 or 554 passing through the space 558. The component of the third substantially white light 573 is much smaller in proportion to the other components 571, 572 and 574, and thus, relatively negligible. The light 571-574 is then mixed in the surrounding medium and will be perceived as a substantially white light having a color point depending on the proportion of each of the light components 571-574 explained above.

Figure 6A:
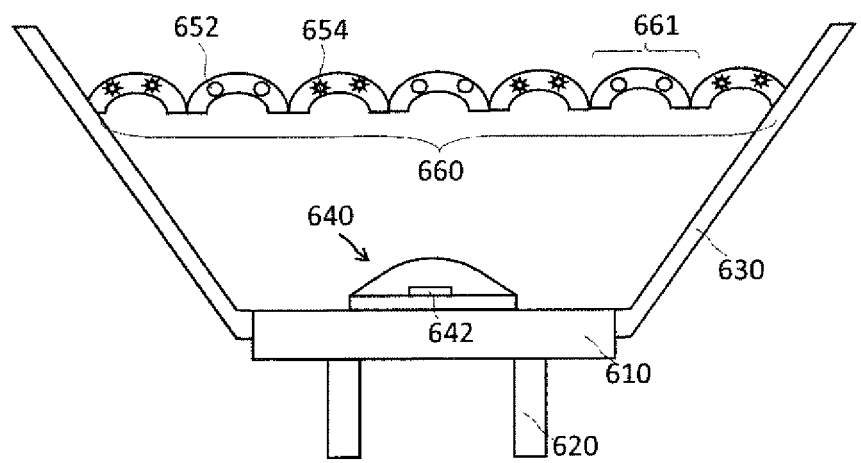
FIG. 6A illustrates a cross-sectional view of a lighting apparatus having a carrier layer with curved structures.
Figure 6B:
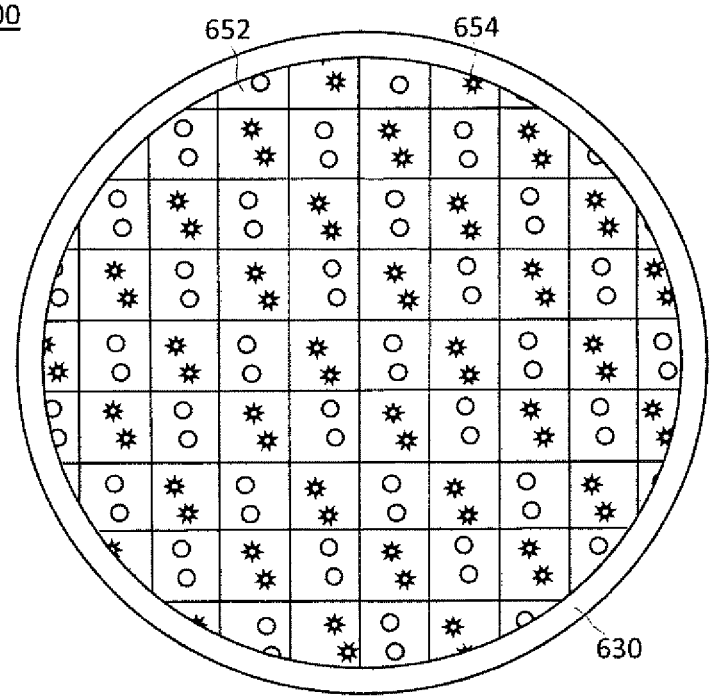
FIG. 6B illustrates a top view of the lighting apparatus shown in FIG. 6A.

The carrier layer 560 may not be flat, but may be formed in any shape preferably being distanced from the light source 540. An example is shown in FIG. 6A, which illustrates a cross-sectional view of a lighting apparatus 600 having carrier layer 660 with curved structures 661. FIG. 6B illustrates a top view of the lighting apparatus 600, shown in FIG. 6A. The lighting apparatus 600 comprises a substrate 610, a connector 620, a housing 630, a light source 640 and a carrier layer 660. The carrier layer 660 comprises a plurality of curved structures 661. The curvature of the curved structures 661 may have desired optical properties that may be useful in a lighting fixture, such as a lens shape. As shown in FIG. 6B, the curved structures 661 may define a rectangle in the top view.

The curvature of the curved structures 661 enables the carrier layer 660 to be fabricated using a molding method. For example, the carrier layer 660, shown in FIG. 6A, may be fabricated using a mold (not shown) having mold pockets defining the curved structures 661. Wavelength-converting materials 652-654 may be premixed individually in two different epoxies or silicones in liquid or semi-liquid form. The wavelength-converting materials 652-654 in the epoxies may be then dispensed into the alternating mold pockets, respectively. The epoxy having the first wavelength-converting material 652 inside a mold pocket may be physically separated from the second wavelength-converting material 654 that is in another mold pocket. Alternatively, the wavelength-converting materials 652-654 may be allowed to mix at the edges where the pockets meet. A clear epoxy without any wavelength-converting materials 652-654 is then filled into the mold pockets such that all the mold pockets are interconnected through the clear epoxy. The liquid epoxy in the mold are then cured into a solid form to form the carrier layer 660 as shown in FIG. 6A. Compared to FIG. 2, as each curved structure 661 has one type of the wavelength-converting material 652 or 654, a substantial portion of light passing through the carrier layer 660 is converted by only one type of the wavelength-converting materials, 652 or 654. Double conversion may be substantially reduced.

Figure 7:
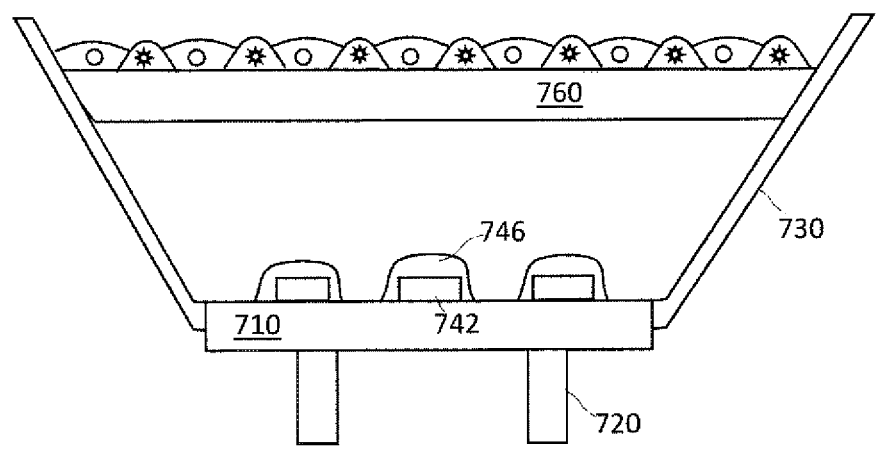
FIG. 7 illustrates a cross-sectional view of a lighting apparatus having a carrier layer with multiple light source dies attached directly to a substrate.

For solid-state lighting applications, the light source 640 may have high power dies 642. However, in some circumstances, smaller dies having higher power efficiency may be preferred. In such situations, bare dies may be preferred over a packaged light source, such as 620 shown in FIG. 7. A bare die is a light source die 742 without any packaging. Without the packaging, more dies 742 may be attached per unit area. FIG. 7 shows a cross-sectional view of a lighting apparatus 700 comprising a substrate 710, a connector 720, a housing 730, a plurality of light source dies 742 and a carrier layer 760. The light source dies 742 are bare dies attached directly to a substrate 710. The electrical connection between the light source die 742 and the substrate 710 may be established by wire bonding (not shown) the dies 742 to the substrate 710. Alternatively, for flip chip type of light sources 742, solder ball (not shown) may be used in the place of the wire bond. The light source die 742 may be protected by an encapsulant 746 encapsulating the light source die 742 to the substrate 710.

Figure 8:
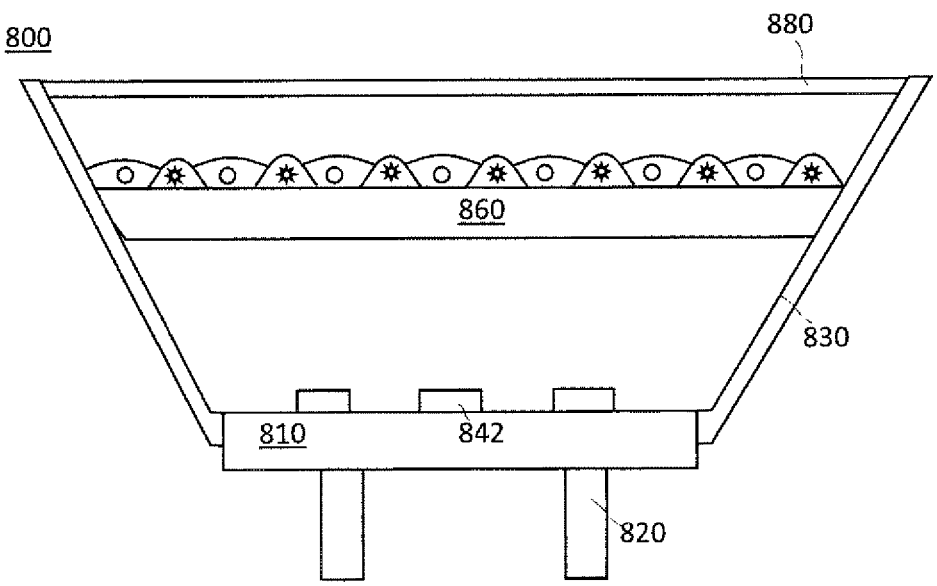
FIG. 8 illustrates a cross-sectional view of a lighting apparatus having a carrier layer and an additional diffuser layer.

FIG. 8 shows an embodiment of a lighting apparatus 800 having a plurality of light source dies 842 attached directly to the substrate 810. The lighting apparatus 800 comprises a substrate 810, a connector 820, a housing 830, a plurality of light source dies 842, a carrier layer 860 and a diffuser layer 880. The lighting apparatus 800 differs from the lighting apparatus 700 at least in that the light source dies 842 are not encapsulated and that an additional diffuser layer 880 is attached to the housing 830. In the embodiment shown in FIG. 8, the light source dies 842 are ultra-violet emitting dies which are robust to moisture of the surroundings, such that encapsulation or isolation from the surroundings are not required.

In the embodiment shown in FIG. 8, the diffuser layer 880 may be assembled below or above the carrier layer 860, or both below and above the carrier layer 860 depending on whether light mixing is required prior to or after entering the carrier layer 860. Attaching the diffuser layer 880 above the carrier layer 860 may enhance mixing of portions of light having different color points. The diffuser may be particularly useful especially if the light source dies 842 are not binned or not tightly controlled.

Figure 9:
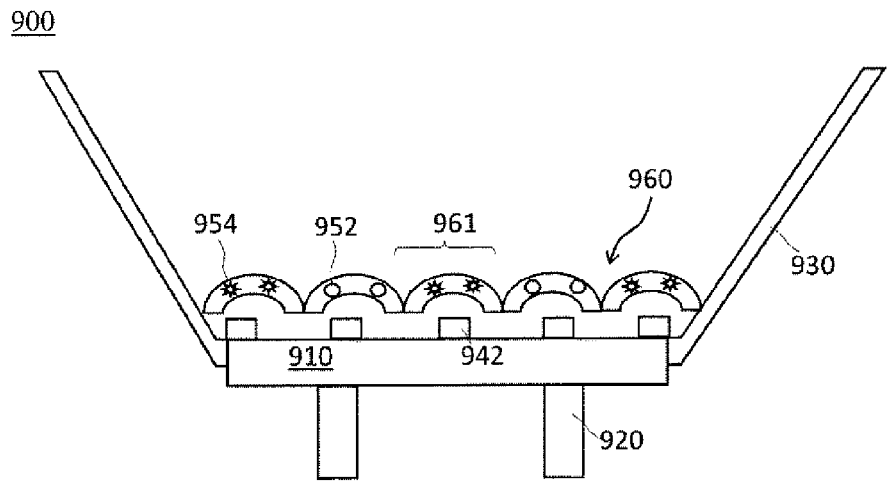
FIG. 9 illustrates a cross-sectional view of a lighting apparatus having a carrier layer comprising curved structures corresponding to each light source die.

FIG. 9 illustrates a lighting apparatus 900 having a carrier layer 960 comprising a plurality of curved structures 961. The lighting apparatus 900 comprises a substrate 910, a connector 920, a housing 930, a plurality of light source dies 942, and a carrier layer 960. Each of the curved structures 961 is positioned to substantially correspond to each light source die 942, such that each light source die 942 is configured to emit light that passes through only one corresponding curved structure 961. With this arrangement, more than one type of light source die 942 may be used. The wavelength-converting materials 954 and 952 may be selected to correspond to the type of the light source die 942. The carrier layer 960 is distanced away from the light source dies 942 and not in direct thermal contact to ensure thermal isolation between the carrier layer 960 and the light source dies 942.

Figure 10:
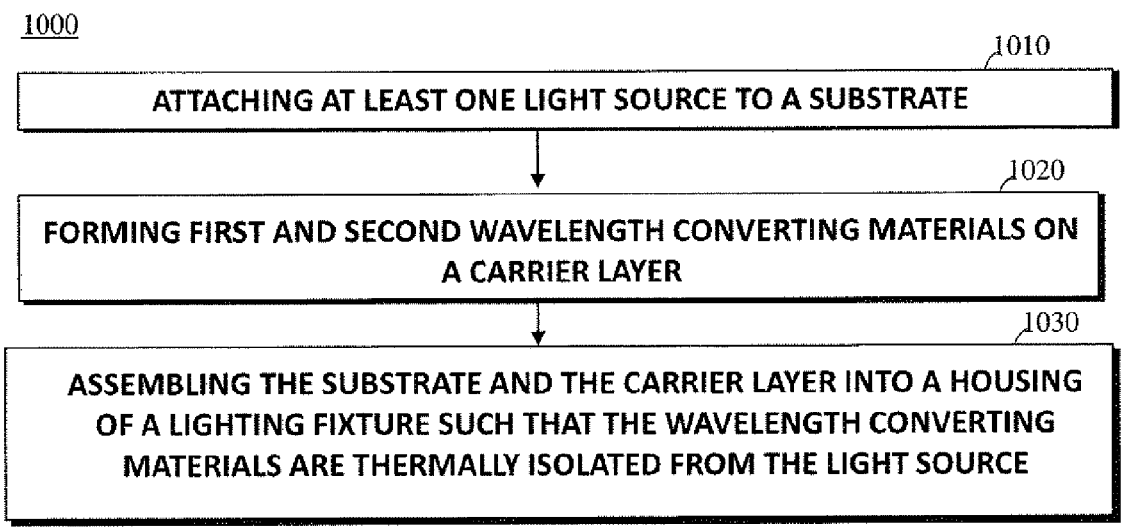
FIG. 10 illustrates a method for isolating the wavelength-converting material from the light source die.

FIG. 10 is a flow chart illustrating a method for isolating the wavelength-converting material from the light source die through a carrier layer. In step 1010, at least one light source is attached to a substrate. The light source may be a packaged LED or a bare die. For bare dies, an additional step of wire bonding may be required. The light source is configured to be connected to an external power source to produce a narrow band light. The method then proceeds to step 1020 in which first and second wavelength-converting materials are formed on a carrier layer. Step 1020 may include or be followed by a curing step. Finally, in step 1030 the substrate and the carrier layer are assembled into a housing of a lighting apparatus or a lighting fixture, such that the carrier layer is distanced away from the light source to provide substantial thermal isolation between the carrier layer and the light source. The carrier layer is positioned such that light emitted by the light source will pass through the carrier layer so that the wavelength of the narrow band light emitted by the light source is converted into a substantially broad-spectrum white light.

Figure 11:
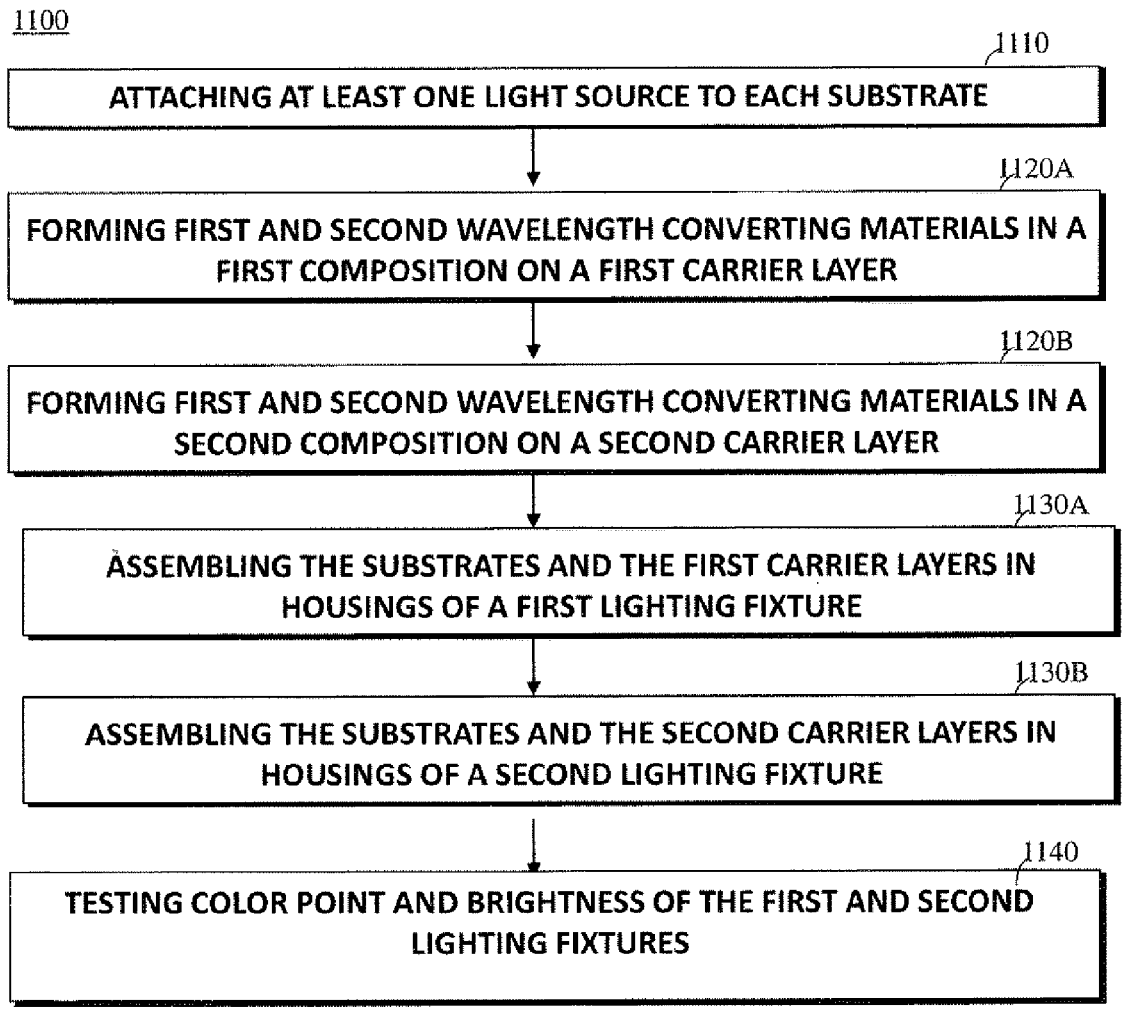
FIG. 11 illustrates a cost effective method for manufacturing the lighting apparatus with reduced inventories.

The method shown in FIG. 10 can be adapted to become a cost effective method to produce lighting apparatus having different color points. The method is shown in FIG. 11. Instead of stocking inventory of multiple groups and bins of packaged LEDs, the method shown in FIG. 11 requires the inventory of each individual component without binning consideration. In step 1110, a plurality of substrates are provided and at least one light source is attached to each substrate. Next, in step 1120A, the first and second wavelength-converting materials are formed in a first composition on a first carrier layer and in step 1120B, the first and second wavelength-converting materials are formed in a second composition on a second carrier layer. Steps 1110, 1120A, 1120E may be performed concurrently, or in any other sequences. Next the method proceeds to step 1130A, in which a portion of the substrates and the first carrier layers are assembled into housings of a first lighting fixture. Likewise, in step 1130B, the substrates and the second carrier layers are assembled into housings of a second lighting fixture. This is followed by step 1140, in which the color point of the lighting fixture is tested. The lighting fixture may be binned accordingly. In case other color points are required, the composition of the first and second wavelength-converting material may be altered. In order to change a color point of the lighting fixture, a different carrier layer having different composition of the first and second wavelength-converting materials may replace the carrier layer. For example, the first carrier layer may be removably replacable by the second carrier layer so that a different color point can be obtained.

Although specific embodiments of the invention have been described and illustrated herein above, the invention should not be limited to any specific forms or arrangements of parts so described and illustrated. For example, the light source dies described above may be LED dies or some other future light source die. Three or more wavelength-converting materials may be applied to the carrier layer. Likewise, the wavelength-converting material may be any material capable converting a narrow wavelength into a broad-spectrum, as known or later developed without departing from the spirit of the invention and not limited only to phosphorus material used in the examples illustrated above. The scope of the invention is to be defined by the claims appended hereto and their equivalents. Similarly, manufacturing embodiments and the steps thereof may be altered, combined, reordered, or other such modification as is known in the art to produce the results illustrated.

What is claimed is:

1. A lighting apparatus, comprising:
a housing having a side surface defining an opening;
a substrate located within the opening of the housing;
at least one light source attached to the substrate, the at least one light source being configured to emit light having a first peak wavelength, wherein at least a portion of the emitted light can be reflected by the side surface;
a carrier layer located within the opening and positioned directly on the side surface of the housing, wherein the carrier layer has opposing side surfaces and is substantially thermally isolated from the light source; and
first and second wavelength converting materials configured to convert the light emitted from the at least one light source into a substantially white light having a first color point; wherein the first wavelength-converting materials are arranged on one of the opposing surfaces of the carrier layer such that a substantial portion of light emitted from the light source passes through only the first wavelength-converting materials, wherein the second wavelength-converting materials are arranged on an other one of the opposing surfaces of the carrier layer such that a substantial portion of light emitted from the light source passes through only the second wavelength-converting materials, and wherein at least a portion of the emitted light can be reflected by the side surface toward the first and second wavelength-converting materials.

2. The lighting apparatus of claim 1, wherein the carrier layer is removably replaceable using a second carrier layer having a different composition from the first and second wavelength-converting materials to obtain the substantially white light having a second color point.

3. The lighting apparatus of claim 1, wherein the carrier layer is made from a glass material.

4. The lighting apparatus of claim 1, wherein the light source is a packaged light-emitting device.

5. The lighting apparatus of claim 1, wherein the light source is a light-emitting die.

6. The lighting apparatus of claim 5, wherein the light-emitting die is encapsulated on the substrate using an encapsulant.

7. The lighting apparatus of claim 1, wherein at least one of the first and second wavelength-converting materials is positioned in a systematic manner.

8. The lighting apparatus of claim 1, wherein the first and second wavelength-converting materials are formed on the carrier layer in an encapsulant material.

9. The lighting apparatus of claim 8, wherein the first wavelength-converting materials are positioned in a systematic manner and the second wavelength-converting materials are positioned between the first wavelength-converting materials.

10. The lighting apparatus of claim 1, wherein the carrier layer has a transparent portion.

11. The lighting apparatus of claim 1, wherein the first and second wavelength-converting materials are in a medium capable of being printed, wherein the first and second wavelength-converting materials are printed on the carrier layer.

12. A lighting apparatus, comprising:
a housing having a side surface defining an opening;
a substrate located within the opening of the housing;
at least one light source attached to the substrate, the at least one light source being configured to emit light having a first peak wavelength, wherein at least a portion of the emitted light can be reflected by the side surface;
a carrier layer located within the opening and positioned directly on the side surface of the housing, wherein the carrier layer has opposing side surfaces and is substantially thermally isolated from the light source; and
first and second wavelength converting materials configured to convert the light emitted from the at least one light source into a substantially white light having a first color point; wherein the first and second wavelength-converting materials are arranged on at least one of the opposing surfaces of the carrier layer such that a substantial portion of light emitted from the light source passes through only one of the first and second wavelength-converting materials, and wherein at least a portion of the emitted light can be reflected by the side surface toward the first and second wavelength-converting material,
wherein the carrier layer defines a plurality of curved structures, and
wherein each of the plurality of curved structures comprises substantially only one of the first or second wavelength-converting materials.

13. The lighting apparatus of claim 12, wherein each curved structure is located corresponding to each light source, respectively.

14. The lighting apparatus of claim 12, wherein the carrier layer is formed by molding an encapsulant premixed separately with the first and second wavelength-converting materials in liquid form in mold pockets, followed by curing the encapsulant into a solid form.

15. A lighting system, comprising:
a housing having a side surface defining an opening;
a substrate located within the opening of the housing;
at least one light source connected to the substrate, the at least one light source being configured to emit light having a first peak wavelength;
a carrier layer located within the opening and positioned directly on the side surface of the housing, wherein the carrier layer has opposing side surfaces and is distanced away from the light source to be thermally isolated from the light source; and
first and second wavelength-converting materials formed respectively on opposing surfaces of the carrier layer and configured to convert the light emitted from the at least one light source to a substantially white light having a first color point, wherein the first and second wavelength-converting materials are arranged such that a substantial portion of light emitted from the at least one light source passes through only one of the first and second wavelength-converting materials, wherein at least a portion of the emitted light can be reflected by the side surface toward the first and second wavelength-converting material, and wherein the first and second wavelength-converting materials are substantially thermally isolated from the at least one light source.

16. The lighting system of claim 15, wherein the carrier layer is removably replaceable with a second carrier layer having a different composition of first and second wavelength-converting materials to obtain a substantially white light having a second color point.

* * * * *